United States Patent [19]

Roundy

[11] 4,072,863
[45] Feb. 7, 1978

[54] PYROELECTRIC INFRARED DETECTION SYSTEM

[76] Inventor: Carlos B. Roundy, 1379 Juniper Drive, Logan, Utah 84321

[21] Appl. No.: 735,457

[22] Filed: Oct. 26, 1976

[51] Int. Cl.$^2$ ............................................... H01J 31/50
[52] U.S. Cl. ................................... 250/332; 250/330; 250/334
[58] Field of Search .................... 250/330, 332, 334

[56] References Cited

U.S. PATENT DOCUMENTS

| 3,846,820 | 11/1974 | Lampe et al. ................ 250/332 X |
| 3,919,555 | 11/1975 | Singer ............................ 250/332 |
| 3,932,753 | 1/1976 | Stotlar ........................... 250/332 |

*Primary Examiner*—Archie R. Borchelt
*Attorney, Agent, or Firm*—Criddle, Thorpe & Western

[57] ABSTRACT

A pyroelectric infrared radiation detection system includes a high density solid state pyroelectric detector array for detecting infrared radiation impinging thereon and for producing signals representing the detected radiation, apparatus for readout of the signals from the detector array, and an optical chopper for successively interrupting the radiation impinging on the detector array. In some applications, an integrating device for integrating the signals produced by the detector array would also be included. The optical chopper interrupts or chops the infrared radiation at a relatively high rate to reduce thermal diffusion in the detector array and thereby improve the spatial resolution. In low radiation intensity applications, signals which might otherwise be lost due to the fast chopping are recovered by providing electronic integration or accumulation of the signals produced by the detector array.

9 Claims, 4 Drawing Figures

PYROELECTRIC INFRARED DETECTION SYSTEM

BACKGROUND OF THE INVENTION

This invention relates to infrared radiation detection and more particularly to a solid state pyroelectric infrared radiation detection system.

An infrared image convertor or detector is a device for forming a visual image of a scene emitting infrared radiation. It may be likened unto an infrared analog of a television camera whch forms an image from visible light radiation. The uses of infrared detection systems and image converters are well known and include missile tracking, remote temperature measurement, viewing night scenes, etc.

Perhaps the most commonly used type of infrared detection systems at the present time are the so-called single element cryogenically cooled quantum detectors which utilize a mirror or system of mirrors to sequentially pan the points of a scene onto the detector. This type of detector, although very sensitive, is also very costly and difficult to maintain because of the need for cooling liquids.

Another type of infrared detection system utilizes pyroelectric material to detect incident infrared radiation, the signals of which may then be presented on some type of display device. In pyroelectric material, incident infrared radiation causes temperature changes and as a result a displacement current is generated which is proportional to the rate of temperature change. That is, infrared radiation incident on pyroelectric material causes the material to produce a changing polarization and surface charge thus giving rise to a displacement current. By appropriate measurement of the displacement current, an image can be produced of the incident infrared radiation. See for example "The Outlook for Pyroelectric Imaging Systems" by C. N. Helmick, Jr., *Proceedings of the* 1973 *Electro-Optical Systems Design Conference,* pages 195–207, and D. Pearsall, U.S. Pat. No. 3,581,092.

One requirement for pyroelectric infrared detection systems of the type mentioned above is that the pyroelectric material must be subjected to a temperature change or changes between readouts of the electrical charge patterns produced in the material since the displacement current in the material is produced by changes in temperature. That is, the infrared radiation falling on the pyroelectric material must in some manner be time modulated and this can be done by provision of an infrared optical chopper between the material and the scene producing the infrared radiation. The slower the chopping rate, the longer is the time the heat from the infrared radiation can integrate on the pyroelectric material to produce larger temperature changes and thus larger displacement currents. The result is better sensitivity, i.e., good ability to detect even low level infrared radiation. However, in previous pyroelectric detection systems, the slow chopping results in poor spatial resolution due to lateral thermal diffusion in the pyroelectric material. Thermal diffusion is simply the flow of heat from hot to cold areas giving rise to a smearing of the image. Slow chopping rates give the heat more time to flow from the hot to the cold areas before the signals are read from the pyroelectric material.

In solid state, pyroelectric infrared image detectors (those in which the pyroelectric material is mated with sold state readout electronics), slow chopping gives rise to another problem and this is that the heat produced in the pyroelectric material tends to flow through the mechanical electrode connections to the solid state electronics and thereby reduce the detected temperature changes in the material. The displacement current and the signals produced by the pyroelectric material is thus reduced. This problem was solved in low density pyroelectric arrays by mounting the pyroelectric material over an air gap and providing connection electrodes remote from the active detector area. This is feasible, however, only when the detector element spacing is 0.5mm or more. With higher density arrays, such as is possible with integrated circuit readout electronics, remote electrodes become impractical to use, especially with 2 dimensional arrays. Chopping the incident infrared radiation at a faster rate would also serve to obviate this problem since the heat would have less time, between sampling the signals from the pyroelectric material, to flow from the material into the solid state electronics. This would appear to be more economical and feasible than the previously mentioned spacing of connection electrodes; or of other techniques which have been tried such as making very low thermal conductivity electrodes.

SUMMARY OF THE INVENTION

It is an object of the present invention to provide a rugged, compact, reliable and inexpensive pyroelectric infrared detection system.

It is another object of the present invention to provide a solid state pyroelectric infrared detection system in which the spatial resolution or density of detector elements may be improved without significantly reducing the sensitivity thereof.

It is a further object of the present invention to provide a solid state pyroelectric detection system which has a relatively rapid chopping rate of the incident infrared radiation and which, in certain applications, includes provision for electronic integration or accumulation of signals produced as a result of the incident radiation.

It is still another object of the present invention, in accordance with one aspect thereof, to provide such a pyroelectric infrared detection system in which fixed pattern noise is substantially eliminated by processing of the signals produced by the incident radiation.

The above and other objects of the invention are realized in a specific illustrative embodiment of a pyroelectric infrared detection system which includes a pyroelectric detector array having a plurality of individual detector elements, each adapted to detect infrared radiation applied to that element and to produce signals representative of the detected radiation. Also included is apparatus for successively interrupting the application of radiation to the array, and apparatus for reading out the signals from the detector elements. For low energy applications, the system would also include apparatus for integrating or accumulating over some predetermined period of time the signals produced by and read from the detector array. The resultant signals, either unintegrated or integrated, may be used in a multiplicity of ways, known to those skilled in the art, to obtain the desired information about the scene producing the infrared radiation.

The apparatus for interrupting the incident radiation is adapted to interrupt or chop the radiation at a relative fast rate to thereby reduce both lateral and vertical diffusion of the heat produced in the detector array. Substantially any signal which might otherwise be lost due to the fast chopping may be recovered by the integrating process.

BRIEF DESCRIPTION OF THE DRAWINGS

The above and other objects, features and advantages of the present invention will become apparent from a consideration of the following detailed description presented in connection with the accompanying drawings in which.

DETAILED DESCRIPTION

Figure 1:
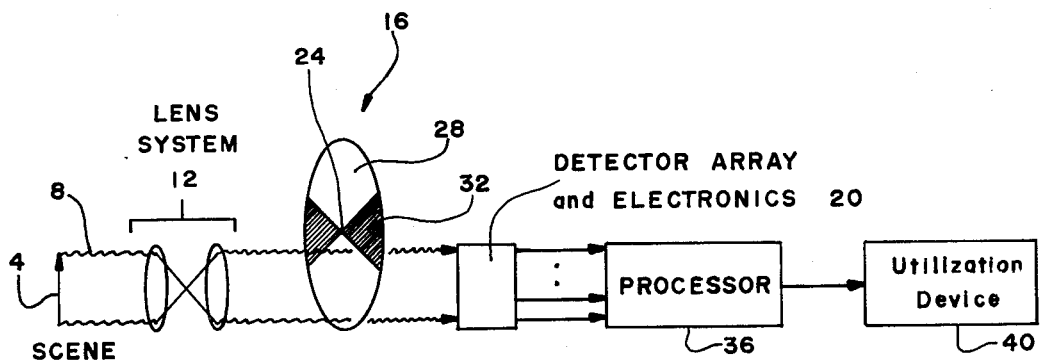
FIG. 1 is a schematic view of a pyroelectric infrared detection system made in accordance with the principles of the present invention.

Referring now to FIG. 1, there is shown a schematic of the pyroelectric infrared detection system made in accordance with the present invention. An upright arrow 4 is used to represent a scene which is emitting infrared radiation 8. This might be an immobile, static scene or a moving, active scene. It may also be an infrared laser in which case the lens system 12 may not be necessary. The infrared radiation 8 is shown being intercepted by a lens system 12 which is adapted to focus and direct the radiation through an infrared optical chopper 16 to a pyroelectric detector array 20. The illustrative optical chopper 16 includes a generally round disc mounted to rotate about an axis 24, with the disc having alternating sections 28 which are transparent to infrared radiation and sections 32 which are opaque to infrared radiation. When the disc is rotated, the opaque sections 32 successively interrupt the application of infrared radiation to the pyroelectric detector array 20. All this is known in the art.

Figure 2:
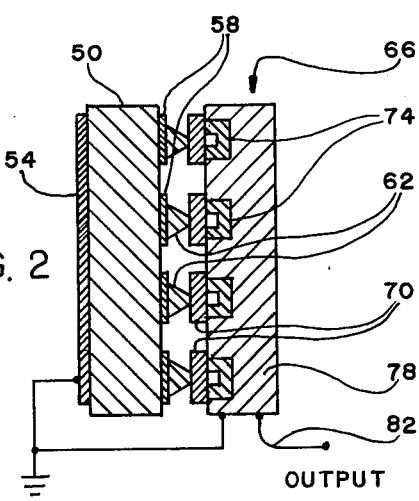
FIG. 2 is a cross sectional view of the pyroelectric detector array and electronics of FIG. 1.
Figure 3:
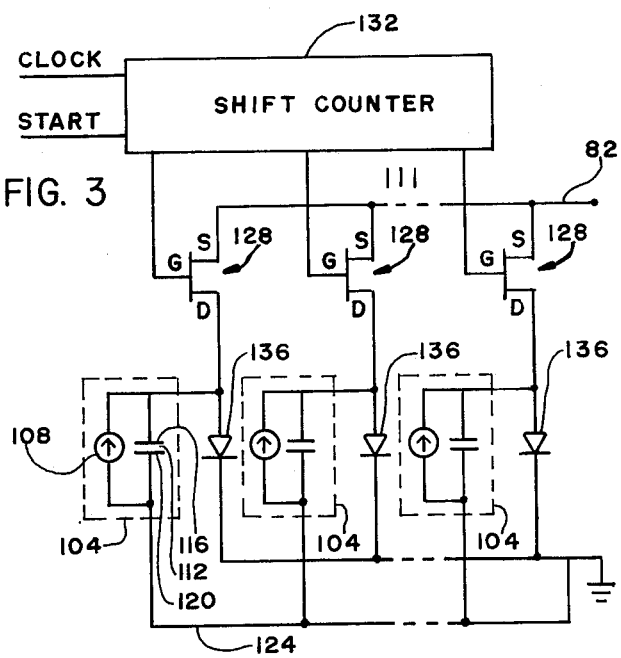
FIG. 3 is a schematic representation of one embodiment of the circuit configuration of the pyroelectric detector array and electronics of FIG. 1.

The pyroelectric detector array 20 is adapted to produce signals representative of the incident infrared radiation and apply these signals to a processor 36. As will become more clear later on, the detector array 20 is fabricated to have an array of individual sensor or detector elements, each of which produces a signal representative of the infrared radiation impinging thereon. The signals from each detector element may be applied in parallel, in series, or in a combination of series and parallel, to the processor 36. The specific illustrative embodiment of the detector array to be discussed in connection with FIGS. 2 and 3 provides for a sequential application of the signals to the processor, but it should be understood that parallel application could also be provided. For example, in a two dimensional array the elements in a row may be applied in sequence but the rows applied in parallel.

The processor 36 is adapted to integrate or accumulate in a memory the signals produced by the detector array 20. One memory position or location is provided for each detector element in the array so that in successive frames (periods of time during which infrared radiation is either being applied to the detector array 20 or being interrupted), the signal from each detector element is added to the signal already stored in the memory location dedicated to that element. The processor 36 can be either an analog or digital device. After such integration or accumulation of signals has occurred over some predetermined number of frames, the resultant is applied to a utilization device 40 such as a visual display, a computer or other decision making device. The utilization device 40 may, for example, be a type of cathode ray tube responsive to signals from the processor 36 for forming pictures representative of the scene for emitting the infrared radiation.

As indicated earlier, it is desirable to interrupt or chop the infrared radiation applied to the detector array 20 at a relatively fast rate so that heat produced in the pyroelectric material of the detector array (to be discussed) will not have time, during a single frame, to flow laterally to adjacent cold areas in the material. However, if faster chopping is performed, there is less time during each frame for heat to "integrate" in the pyroelectric material. Thus, compensation is made for this by integrating or accumulating successive signals from each detector element electronically in the processor 36. Electronic signal integration recovers the signal lost due to the faster chopping to thereby maintain the sensitivity of the detector system while also providing good spatial resolution in the detected scene. The chopping rate is selected to obtain the resolution quality desired. A chopping rate of from 30 Hertz to 1000 Hertz would advantageously provide a desirable resolution quality for most types of pyroelectric material such as triglycene sulfate and lithium tantalate. For this range of chopping rates, the processor 36 would advantageously be adapted to integrate or accumulate signals from the detector elements of detector array 20 over a period of from one frame to one hundred or more frames. Using these techniques, arrays with detector element spacing of from 0.5 millimeters down to 25 microns could achive good spatial resolution with low thermal crosstalk or thermal smear.

In some applications, for example infrared laser detection, integration of the signals produced from the detection operation may not be needed even with the fast chopping if the detected radiation is of sufficient intensity. Fast chopping would still be employed to improve resolution but, due to the intensity of the radiation, sensitivity can be maintained without integration.

FIG. 2 shows a side cross sectional view of an exemplary solid state pyroelectric detector array and readout electronics. The detector array includes a thin slab or layer of pyroelectric single crystal material 50 disposed between a front transparent or radiation absorbing, common electrode 54 and a plurality of rear electrodes 58. As already indicated a variety of materials could be used for the pyroelectric crystalline material 50. The thickness of the layer 50 might illustratively be from 25 to 200 microns. The front common electrode 54 advantageously is a single continuous piece of material disposed on the pyroelectric material 50 to face in the direction of the scene being detected. The front electrode material may be chromium, nickel, nichrome, aluminum, etc., with the requirement that it be either transparent or capable of absorbing infrared radiation, depending on the application and wave length of interest. For wide spectral response absorption in the electrode 54, the electrode should have a resistance of about 240 ohms per square, and for narrow spectral response absorption in the pyroelectric material 50, the electrode 54 should have a resistance of from 1,000 to 10,000 ohms per square. The electrode 54 may be vacuum deposited on the pyroelectric material 50.

On the side of the pyroelectric material 50 opposite the front common electrode 54 are a plurality of individual rear electrodes 58. These may also be vacuum deposited on the pyroelectric material and then photoetched to define the electrode geometry desired. The rear electrodes 58 advantageously could be chromium covered with gold, nickel, nichrome, aluminum, etc. The rear electrodes 58 are used to define the sensing or resolution areas of the detector array. Each such electrode 58 together with readout electronics to be described, comprise a sensor or detector element of the array. The above type of construction becomes advantageous with linear arrays of element spacing less than about 0.5 millimeters and with two dimensional arrays of more than about 9 elements.

Formed on each of the rear electrodes 58 is a raised contact electrode 62 suitable for contacting the readout electronics generally indicated by the arrow 66. In particular, each raised contact electrode 62 makes contact with a metalization electrode 70 positioned on a photodiode array 74. The particular construction shown illustrates the primary advantage of the fast chopping in that the rear electrode design is dictated by ease of construction rather than by thermal considerations. The photodiode array 74 and metalization electrodes 70 are parts of an integrated circuit substrate 78 which, advantageously, is fabricated to also include multiplexing readout electronics (not shown in FIG. 2) to hereafter be described. A suitable example of a photo-diode and readout array is the model RL-64 solid-state line scanner produced by Reticon Corporation. Many other types of integrated circuit arrays could be used in this invention even though the exact method of electronic connection between the pyroelectric array and integrated circuit array may not be the same as illustrated in FIGS. 2 and 3. For example the "Self Scanned Photo Diode" array illustrated in FIG. 3 could instead be a "Charge Coupled Device", a "Charge Injection Device", a "Bucket Brigade Device", etc.

The front common electrode 54 is coupled to ground potential as is the readout circuitry. An output lead 82 provides for conveying the signals produced by the detector elements sequentially to the processor 36 shown in FIG. 1.

The circuit diagram of the illustrative pyroelectric detector array and associated electronics is shown in FIG. 3 to include schematic representations 104 of the individual pyroelectric detector elements. These elements show schematically a charge generator 108, representing the polarization and surface charge produced in the pyroelectric material when irradiated by infrared radiation. Also included in the schematic representation of a detector element 104 is an equivalent capacitor 12 whose upper plate 116 represents a rear electrode (shown at 58 in FIG. 2) and whose lower plate 120 represents the front common electrode (shown at 54 in FIG. 2). The lower plate 120 (front electrode) of each detector element 104 is coupled by way of conductor 124 to ground potential. The upper plate 116 (rear electrode) of each detector element 104 is coupled to the drain electrode D of a corresponding field effect transistor (FET) 128. The gate electrode G of each FET, in turn, is coupled to a shift counter 132 and the source electrode S is coupled to a conductor 82 which is the output of the readout electronics of the photodiode array. The upper plate 116 (rear electrode) of each detector element 104 is also coupled to the anode of a corresponding diode 136 whose cathode is coupled to ground potential. (The diode is not an essential element for the pyroelectric array but is a standard part of the Reticon RL-64 array.)

In operation, the pyroelectric material 50 (FIG. 2) is exposed to infrared radiation so that the radiation is applied via the front common electrode 54 to the material. The infrared radiation is absorbed either in the front electrode 54 or in the pyroelectric material 50 itself, as earlier discussed. The absorbed radiation heats up the pyroelectric material 50 and causes the material to generate opposite polarity charges on the front and rear surfaces of the area that is heated. Of course, depending upon the pattern of infrared radiation falling on the front electrode 54, some areas will be heated and some will not. The charge patterns produced in the areas heated are "transferred" from the detector to the readout electronics. 66 via the raised contact electrodes 62 and the metalization electrodes 70.

The manner of detecting the charge pattern produced by the incident radiation in the pyroelectric material 50 and of reading out the charge pattern may be understood by referring to FIG. 3. Each capacitor 112 of the detectors 104 will either have a charge produced thereon if the area of the pyroelectric material about which that capacitor is positioned is heated up or will not have a charge if the corresponding area is not heated. Thus, various ones of the capacitors will be charged to an amount determined by the incident radiation (represented by charge generator 108) and various ones will not be charged. Near the end of the first open frame (period during which radiation is allowed to fall on the pyroelectric detector), the shift counter 132 is started in operation with a signal applied to the lead labeled "start". Coincident therewith, clock pulses are applied to the shift counter 132 via the lead labeled "clock" and in response to these pulses the shift counter 132 sequentially energizes each of the FETs 128. Upon the application of a signal by the shift counter 132 to the gate electrode G of a FET 128, the charge which has accumulated on the corresponding capacitor 112 is gated via the FET to output lead 82. Of course, if no charge has accumulated on a capacitor, then effectively no signal will be applied to the output lead 82.

Energizing the FETs will be completed substantially near the termination of the open frame. During the next frame, which is closed (period during which the infrared radiation is interrupted by the chopper 16), the portions of the pyroelectric material 50 which have been heated by radiation during the initial open frame will begin to cool, for example, by heat transfer to the air, by reradiation, etc. These portions which were warm and are now cooling will thus generate a charge of a polarity opposite that generated during the previous frame. Near the end of the closed frame, the shift counter 132 will again energize each of the FETs 128 to read out the charge generated on the corresponding capacitors 112. This process continues for each successive open and closed frame.

Figure 4:
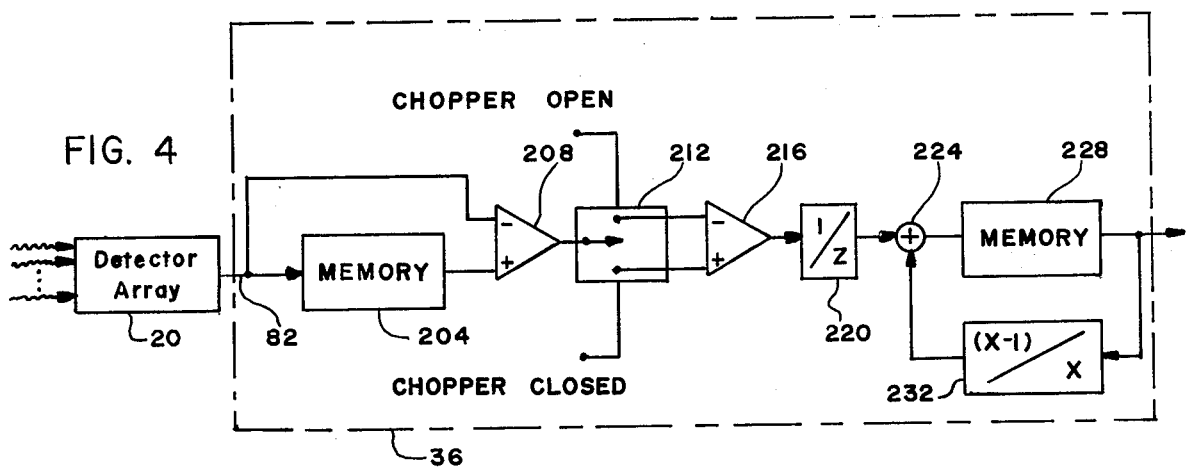
FIG. 4 is an illustrative circuit schematic of one embodiment of the processor of FIG. 1.

The signals produced by the detector elements 104 and supplied via the FETs to output lead 82 are applied to the processor 36 and in particular to a memory or delay line 204 (FIG. 4) and at the same time to the inverting input of a differential amplifier 208. The memory or delay line 204 includes a separate storage area for each of the detector elements of the detector array 20 and is adapted to delay each signal from a detector element by one frame. That is, each signal from a detector element is applied immediately to the inverting input of the amplifier 208 and is also applied, during the next frame, to the noninverting input so that two signals from each detector element are applied to the amplifier during each frame. The amplifier 208 produces a signal representing the difference between each pair of received signals and applies this difference signal to a switch 212.

The purpose of the memory or delay line 204 and the differential amplifier 208 is to eliminate so-called fixed pattern noise. This noise, which is substantially non-varying, is produced by each of the detector elements and can be either positive or negative. Since the differential amplifier 208 produces a signal representing the difference between signals generated in successive chopper frames and since there is no difference between fixed pattern noise in successive frames, the fixed pattern noise is substantially cancelled by the differential amplifier. However, the signal produced by the detector array 20 in alternate frames is of opposite polarity and so it adds in the amplifier 208.

The switch 212 operates in synchronization with the chopper 16 to apply a received signal either to the inverting input or noninverting input of an inverting amplifier 216. Specifically, when the chopper 16 is open or passing incident infrared radiation, the switch applies the signal from the amplifier 208 to the inverting input of the amplifier 216, and when the chopper is closed or interrupting the application of radiation to the detector array 20, the switch 212 passes the received signal to the noninverting input of the amplifier 216. The purpose of this is to provide a sequence of signals which are of the same polarity. Thus, when a signal of positive polarity is produced by a detector element of the detector array 20, the amplifier 208 produces a signal of negative polarity representing the difference between the positive signal produced by the detector element and the previously received negative signal produced by the element. This negative difference signal is then applied to the switch 212 which in turn applies it to the inverting input of the amplifier 216 since, at this time, the chopper is open. When a negative signal is produced by a detector element of the detector array 20, the amplifier 208 produces a positive signal representing the difference between the negative signal produced by the detector element and a previously received positive signal. This positive difference signal is applied to the switch 212 which then applies the signal to the noninverting input of the amplifier 216. In this manner, a train of positive pulses are produced by the amplifier 216.

The signals produced by the inverting amplifier 216 are applied to an attenuator 220 for attenuating or reducing the magnitude of the signal by 1/Z of its original value, where Z may be any number equal to or greater than 1. The signal is then applied to a summing node 224 where it is added to a signal stored in a memory 228 and fed back via another attenuator 232. The memory 228 in this embodiment is an analog memory having a memory position or location corresponding to each of the detection elements of the detector array 20. Each time a signal from a detector element is applied to the summing node 224, it is added to the signal stored in the memory 228 in the location dedicated to that detector element. Thus, the signals produced by each detector element are accumulated or integrated in the memory 228 over some predetermined period of time. The attenuator 232 reduces the signals stored in the memory to $(X-1)/X$ of the original signal, where X is any number greater than 1. The purpose of the attenuator 220 and 232 is simply to maintain the accumulated or integrated signals within some predetermined range of magnitude. If X is equal to Z, then an accumulated or integrated signal would be equal in magnitude to an input signal to the attenuator 220 after about 2X frames of input. If X is not equal to Z then the accumulated signal would have a magnitude of X/Z times the magnitude of the input signals. The time period over which the signal accumulation or integration would take place would be determined by the sensitivity desired by the user as previously discussed, and is a function of X as seen above.

The output from the processor 36 and in particular the memory 228 is applied to a utilization device 40 (FIG. 1) where the information detected by the system may be displayed, processed, etc. In the manner described, infrared radiation is detected using a solid state detection array and thermal diffusion in the array is minimized by providing relatively fast chopping of the incident radiation. The reduction of sensitivity due to the fast chopping is recovered by providing electronic integration or accumulation of the signals produced by the detector elements.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. A pyroelectric infrared detection system comprising
    a pyroelectric detector array having a plurality of individual detector elements, each for detecting infrared radiation applied to the array and for producing signals representative of detected radiation,
    means for successively interrupting the application of radiation to the array, and
    means for integrating over a predetermined period of time, the signals produced by said detector array.

2. A pyroelectric infrared detection system as in claim 1 wherein said pyroelectric detector array comprises
    a layer of pyroelectric material,
    a front electrode disposed on one side of the layer of pyroelectric material, said infrared radiation being applied to the pyroelectric material through the electrode,
    a plurality of rear electrodes disposed on the side of the layer of pyroelectric material opposite the side on which the front electrode is disposed, and
    a plurality of detector means, each coupled to a different one of said rear electrodes for producing signals representative of radiation applied to that portion of the pyroelectric material located between the front electrode and the rear electrode to which said each detector means is coupled.

3. A pyroelectric infrared detection system as in claim 2 wherein said pyroelectric detector array further comprises an output conductor coupled to each of said detector means, and means for causing each of said detector means to sequentially apply the signals produced thereby to said output conductor.

4. A pyroelectric infrared detection system as in claim 1 wherein said integrating means comprises memory means having a plurality of storage locations for storing signals applied thereto, and adder means for adding signals produced by the detector array to signals stored in said memory means and for applying the resultant to said memory means.

5. A pyroelectric infrared detection system as in claim 4 wherein each detector element of said pyroelectric detector array is adapted to produce a signal of one polarity during application of radiation to the element and to produce a signal of opposite polarity during interruption of the application of radiation to the element, said pyroelectric infrared detection system further comprising amplifier means having an inverting input and a non-inverting input, and an output is coupled to said adder means, and switch means for applying the signals of said one polarity from the pyroelectric detector array to one of the inputs of said amplifier means and for applying the signals of said opposite polarity to the other of the inputs of said amplifier means.

6. A pyroelectric infrared detection system as in claim 5 further comprising an attenuator coupled between the output of said amplifier means and said adder means for attenuating the signals applied by the amplifier means to the adder means.

7. A pyroelectric infrared detection system as in claim 6 further comprising means coupled between the pyroelectric detector array and the switch means for producing a difference signal representative of the difference between each signal produced by a detector element of the array and the immediately succeeding signal produced by the element.

8. A pyroelectric infrared detection system as in claim 1 wherein said interrupting means is adapted to interrupt the application of radiation to the array at a rate from about 30 to 1000 Hertz, and wherein said integrating means is adapted to integrate the signals produced by each detector element over a period of from about 1 to 100 frames of the interrupting means.

9. A pyroelectric infrared detection system comprising a pyroelectric detector array having a plurality of individual detector elements spaced apart at a distance of from 0.5 millimeters to 25 microns, each detector element adapted to detect infrared radiation applied to the array and to produce signals representative of detected radiation, means for successively interrupting the application of radiation to the array at a rate of from 30 to 1000 Hertz, output conductor means, and means for applying the signals produced by the detector array to the output conductor means.

* * * * *